(12) United States Patent
Takakuwa et al.

(10) Patent No.: US 6,527,884 B1
(45) Date of Patent: Mar. 4, 2003

(54) HYDROGEN ANNEALING PROCESS AND APPARATUS THEREFOR

(75) Inventors: Yasunori Takakuwa, Tokyo (JP); Kouji Tometsuka, Tokyo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 206 days.

(21) Appl. No.: 09/708,204

(22) Filed: Nov. 7, 2000

(30) Foreign Application Priority Data

Jan. 20, 2000 (JP) .......................................... 2000-012146

(51) Int. Cl.⁷ .............................. C21D 1/26; C21D 1/76
(52) U.S. Cl. ...................... 148/634; 266/250; 266/251; 266/252
(58) Field of Search .......................... 148/634; 266/250, 266/251, 252

(56) References Cited

U.S. PATENT DOCUMENTS 5,578,132 A    11/1996  Yamaga et al.
6,066,508 A  * 5/2000   Tanabe et al. ................ 438/38
6,319,860 B1 * 11/2001  Tanabe et al. .............. 438/795

FOREIGN PATENT DOCUMENTS

JP    4207019    7/1992
JP    5291268   11/1993

* cited by examiner

Primary Examiner—Deborah Yee
(74) Attorney, Agent, or Firm—Katten Muchin Zavis Rosenman

(57) ABSTRACT

An apparatus for selectively implementing a depressurized or an atmospheric hydrogen annealing process comprises a reaction chamber, a hydrogen gas introduction line for feeding hydrogen gas into the reaction chamber and an atmospheric exhaust line and a depressurized exhaust line, which are connected to the reaction chamber. By selectively switching the atmospheric exhaust line and the depressurized exhaust line, the depressurized hydrogen annealing process and the atmospheric annealing process are selectively implemented. A device for performing deoxidization process or a device for removing impurities may be further included.

12 Claims, 3 Drawing Sheets

HYDROGEN ANNEALING PROCESS AND APPARATUS THEREFOR

FIELD OF THE INVENTION

The present invention relates to a method and apparatus for manufacturing a semiconductor; and, more particularly, to a hydrogen annealing process and apparatus therefor for use in manufacturing semiconductor devices.

BACKGROUND OF THE INVENTION

Al or Cu film has been used for the construction of wiring in a semiconductor device. If one or more oxygen molecules remain in the Al or Cu film, they may cause for the fine wiring to be prematurely aged, thereby resulting in short-circuiting. Accordingly, the Al or Cu film on a substrate requires deoxidization by using, e.g., a hydrogen annealing process.

Al film is widely used for wiring in semiconductor devices due to its low cost and excellent fabricability. Since Al itself, however, has relatively high conductor resistance, the wiring with Cu or Cu alloy is more preferred for fabricating a faster processing unit. However, since Cu is easily oxidized, the hydrogen annealing process becomes even more important in case of Cu or Cu alloy wiring.

Japanese Patent Laid-open Publication No. 5-291268 discloses a conventional hydrogen annealing apparatus, operable at an atmospheric pressure. As shown in FIG. 5, a reaction chamber 2 is embedded in a reaction furnace 1, and a boat 3 is loaded or unloaded within the reaction chamber 2. A hydrogen gas introduction line 4 and a vacuum evacuation line 5 are coupled to the reaction chamber 2, wherein the vacuum evacuation line 5 is connected through a valve 6 to a vacuum evacuation device 7. An upstream of the vacuum evacuation line 5 is coupled with a hydrogen combustion pipe 9 through a valve 8, wherein the hydrogen combustion pipe 9 is coupled with a combustion chamber 10 and an end of the hydrogen combustion pipe 9 is equipped with a combustion nozzle 11. A hydrogen ignition line 12 is also coupled with the combustion chamber 10, wherein one end of the hydrogen ignition line 12 is introduced to a vicinity of the combustion nozzle 11 and fired with a pilot burner. An exhaust duct 13 is also coupled with the combustion chamber 10 and an exhaust device (not shown) is connected to the exhaust duct 13. The combustion chamber 10 includes a damper 14 for allowing the inside of the combustion chamber 10 to be vented out to the atmosphere.

In carrying out the hydrogen annealing process using the apparatus, the valve 6 is turned open so that the air in the reaction chamber 2 is evacuated by the vacuum evacuation device 7 and, then, the valve 6 is closed. Hydrogen gas is introduced, under the atmospheric pressure, through the hydrogen gas introduction line 4 to the reaction chamber 2 to perform the hydrogen annealing process and, then, a valve 8 is turned open.

The reacted hydrogen gas is evacuated to the combustion chamber 10. The hydrogen gas released through the hydrogen combustion pipe 9 from the combustion nozzle 11 is fired by the pilot burner for exhaustion in the combustion chamber 10. Since the released hydrogen gas is burned in the combustion chamber 10, the exhaust gas released from the exhaust duct 13 may have no hydrogen gas left or at a level lower than a predetermined value.

A primary object of the hydrogen annealing process is to deoxidize the metal film of Al or Cu, i.e., to remove oxygen molecules off the metal film. Another object is to remove impurities in the metal film, in particular, in the Cu film, to enhance the electrical property thereof. Still another object is to enhance the adhesive property between the Cu film and its underneath layer.

An atmospheric annealing process may be preferable for deoxidizing the metal film, for example, as in a deoxidization process for multilayer wirings.

In order to enhance the electrical property or the adhesive property with the underneath layer a depressurized annealing process at, e.g., about 50 Torr may be preferable.

For example, an etching process, prior to the hydrogen annealing process, may leave impurities and additives attached on the film which have an adverse impact on the characteristics of the device. Since most of the impurities and additives have low vapor pressure, they may be preferably removed in a depressurized state. Through the hydrogen annealing process, the impurities are replaced with hydrogen atoms, so that binding between the metal film and its underneath layer can be enhanced, which in turn results in a higher adhesive property therebetween. In other words, the hydrogen annealing process in a depressurized state may attain not only the deoxidization of the metal film but also better electrical and adhesive properties with the underneath layer. Therefore, the choice between the atmospheric annealing process and the depressurized process may vary with the objective of the annealing process.

Unfortunately, however, the conventional hydrogen annealing apparatus can perform the hydrogen annealing process at an atmospheric process but not at a depressurized condition for the following reasons.

As explained above, the hydrogen gas in the combustion chamber 10 must be burned at the atmospheric pressure in the conventional hydrogen annealing apparatus; and, if the reaction chamber is to be operated in a depressurized state, the gas stream may reflux from the combustion chamber to the reaction chamber. As a result, the hydrogen gas, which is left unused or unreacted, can react with the oxygen gas introduced into the reaction chamber, thereby causing an explosion. The fire from a pilot burner for burning the hydrogen gas may ignite the explosion. Owing to such difficulties, therefore, there has continued to exist a need for a hydrogen annealing apparatus operable at a low pressure.

SUMMARY OF THE INVENTION

It is, therefore, an object of the present invention to provide a method and apparatus capable of performing a depressurized hydrogen annealing process safely.

It is another object of the present invention to provide a method and apparatus capable of performing a depressurized hydrogen annealing process as well as an atmospheric hydrogen annealing process to reduce the equipment cost thereof.

In accordance with a preferred embodiment of the present invention, there is provided a method capable of performing a hydrogen annealing process either at an atmospheric pressure or at a depressurized state in a hydrogen annealing apparatus, wherein the hydrogen annealing apparatus includes a reaction chamber, a hydrogen gas introduction line for feeding hydrogen gas into the reaction chamber and an atmospheric exhaust line and a depressurized exhaust line connected to the reaction chamber, comprising the step of:

Switching the atmospheric exhaust line and the depressurized exhaust line to selectively perform a depressurized hydrogen annealing process or an atmospheric annealing process.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
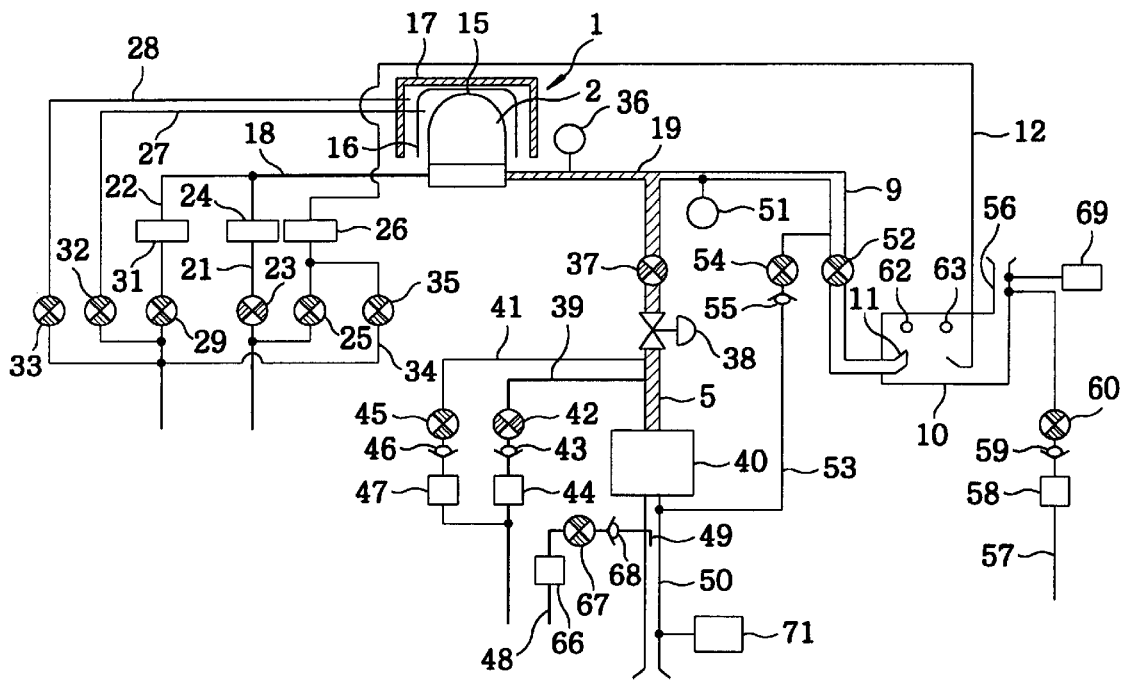
FIG. 1 represents a block diagram for illustrating a depressurized hydrogen annealing process in the hydrogen annealing apparatus in accordance with the present invention.
Figure 5:
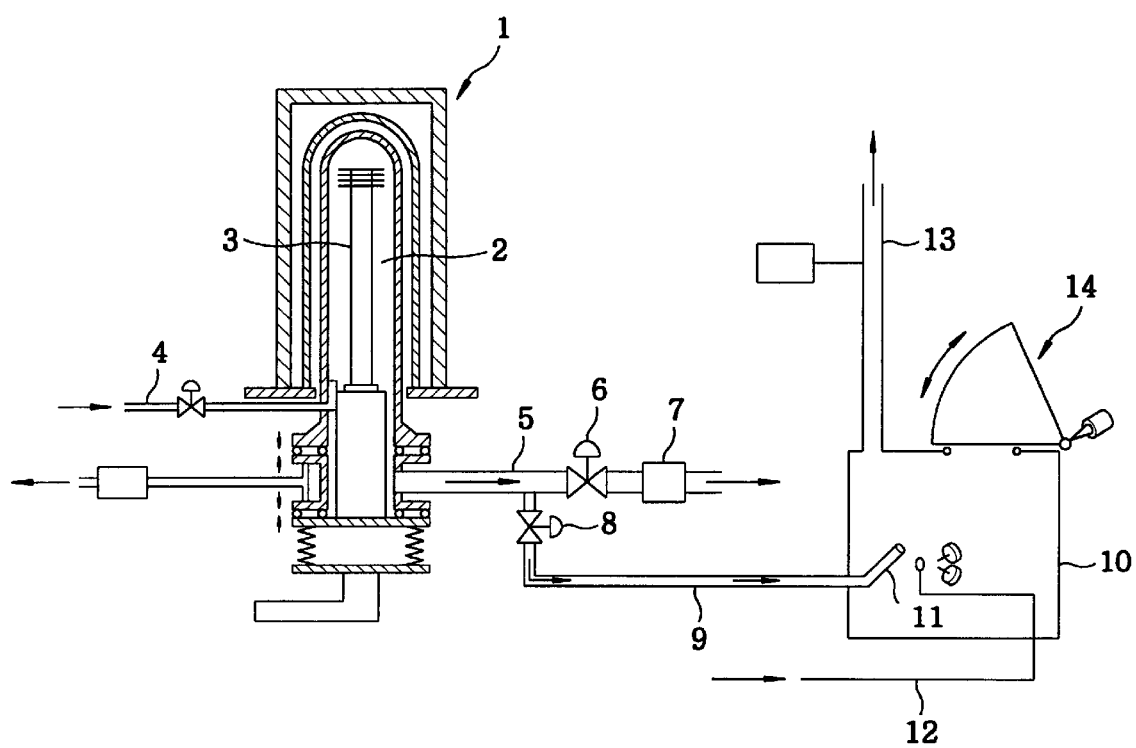
FIG. 5 presents a block diagram of a conventional hydrogen annealing apparatus.

Referring to FIG. 1, there is illustrated a depressurized hydrogen annealing process performed in a hydrogen annealing apparatus in accordance with the present invention. Like reference numerals in FIG. 1 and FIG. 5 represent like elements, respectively.

A reaction furnace 1 includes a reaction tube 15, a soaking tube 16 and a heater 17, which are concentric with each other, and a reaction chamber 2 is located within the reaction tube 15.

A gas introduction line 18 and an exhaust gas line 19 are connected to the reaction tube 15 for their coupling with the reaction chamber 2.

The gas introduction line 18 bifurcates at an upstream end so that one branch is connected to a hydrogen gas source (not shown) as a hydrogen gas introduction line 21 and the other branch is connected to a nitrogen gas source (not shown) as a nitrogen gas introduction line 22.

The hydrogen gas introduction line 21 further branches out at a branch point into a hydrogen ignition line 12, which is introduced into a combustion chamber 10. A hydrogen gas cutout valve 23 and a flow controller 24 are sequentially installed on the hydrogen gas introduction line 21 at a downstream region of the branch point of the hydrogen ignition line 12; and an ignition line switching valve 25 and a flow controller 26 are sequentially installed on the hydrogen ignition line 12.

The nitrogen gas introduction line 22 also branches out further into two nitrogen gas dilution lines 27 and 28, wherein one nitrogen gas dilution line 27 is induced into a space between the reaction tube 15 and the soaking tube 16 and the other nitrogen gas dilution line 28 is led into a space between the soaking tube 16 and the heater 17. A nitrogen gas cutout valve 29 and a flow controller 31 are sequentially installed on the nitrogen gas introduction line 22 toward the downstream of the branch point of the nitrogen gas dilution lines 27 and 28; a first dilution line switching valve 32 is installed on the nitrogen gas dilution line 27; and a second dilution line switching valve 33 is installed on the nitrogen gas dilution line 28. The nitrogen gas introduction line 22, at a branch point thereof located at an upstream region of the nitrogen gas cutout valve 29, is connected through a nitrogen gas bypass line 34 to the hydrogen ignition line 12, at a branch point thereof located between the ignition line switching valve 25 and the flow controller 26; and a bypass switching valve 35 is installed on the nitrogen gas bypass line 34.

A pressure sensor 36 for detecting the pressure of the reaction chamber 2 is installed on the exhaust gas line 19. The exhaust gas line 19 branches out into two at a downstream of the pressure sensor 36, wherein one branch is a vacuum evacuation line 5 for functioning as an evacuation channel and the other branch is induced into the combustion chamber 10 as a hydrogen combustion pipe 9, the end of which opens as a combustion nozzle 11 near the end of the hydrogen ignition line 12.

An exhaust switching valve 37, a flow regulating valve 38 and an exhaust pump 40 are sequentially installed on the vacuum evacuation line 5 from an upstream thereof and an exhaust duct 50 is connected to a downstream of the exhaust pump 40. Further, each of a first nitrogen gas ballast line 39 and a second nitrogen gas ballast line 41 is coupled with the vacuum evacuation line 5 at a point between the flow regulating valve 38 and the exhaust pump 40, wherein both the first nitrogen gas ballast line 39 and the second nitrogen gas ballast line 41 are connected to a nitrogen gas source (not shown).

A first switching valve 42, a first check valve 43 and a first flow control valve 44 are sequentially installed on the first nitrogen gas ballast line 39 toward an upstream thereof; and a second switching valve 45, a second check valve 46 and a second flow control valve 47 are sequentially installed on the second nitrogen gas ballast line 41 toward an upstream thereof.

An exhaust dilution line 48 is coupled with the exhaust duct 50, wherein the exhaust dilution line 48 is connected to a nitrogen gas source (not shown). A flow controller 66, a switching valve 67 and a check valve 68 are sequentially installed on the exhaust dilution line 48 toward a downstream from the nitrogen gas source. An L-type nozzle 49 is installed to an end of the exhaust dilution line 48, wherein the L-type nozzle 49 is open toward the downstream of the exhaust duct 50.

A pressure switch 51 and a switching valve 52 are installed on the hydrogen combustion pipe 9 toward a downstream of a branch point thereof, wherein the pressure switch 52 serves to prevent overpressure inside the reaction chamber 2 and the hydrogen combustion pipe 9. The hydrogen combustion pipe 9, at a point between the pressure switch 51 and the switching valve 52, is connected through a connection line 53 to the vacuum evacuation line 5, at a point in a downstream region of the exhaust pump 40. A switching valve 54 and a check valve 55 are sequentially installed on the connection line 53 in a direction starting from the hydrogen combustion pipe 9 to the vacuum evacuation line 5.

The combustion chamber 10 is connected through an exhaust duct 56 to an exhaust device (not shown). The exhaust duct 56 is connected to an exhaust dilution line 57, which, in turn, is connected to a nitrogen gas source (not shown). A flow controller 58, a check valve 59 and a switching valve 60 are sequentially installed on the exhaust dilution line 57 toward a downstream thereof. A temperature sensor 62 and a spark detection sensor 63 are installed within the combustion chamber 10, wherein the temperature sensor 62 and the spark detection sensor 63 detect whether or not hydrogen gas is burned within the combustion chamber 10.

A gas concentration detector 69 is installed in the exhaust duct 56 in order to detect the hydrogen concentration in the exhaust gas released from the exhaust duct 56.

Referring to FIG. 1, a depressurized hydrogen annealing process will be described in accordance with the present invention.

The second dilution line switching valve 33, the first dilution line switching valve 32, the nitrogen gas cutout valve 29, the ignition line switching valve 25, the bypass switching valve 35, the second switching valve 45, the switching valves 54, 52 and 60 turn to be closed, while the hydrogen gas cutout valve 23, the exhaust switching valve 37, the first switching valve 42 and the switching valve 67 turn open.

If the exhaust pump 40 operates, the reaction chamber 2 turns to be in a depressurized state, wherein the depressurized state represents not a high level vacuum state, but a state with a pressure substantially lower than the atmospheric pressure, e.g., 760 Torr.

When the hydrogen gas cutout valve 23 turns open, hydrogen gas is introduced into the reaction chamber 2 at a flow rate controlled by the flow controller 24. The processed gas is evacuated by the exhaust pump 40 through the vacuum evacuation line 5 into the exhaust duct 50 to be vented out. The pressure sensor 36 detects the pressure in the vacuum evacuation line 5. By controlling the opening of the flow regulating valve 38 and the flow rate of nitrogen gas through the first nitrogen gas ballast line 39, the back pressure of the reaction chamber 2 can be adjusted and, in turn, the pressure of the reaction chamber 2 can also be adjusted. The pressure within the reaction chamber during the depressurized hydrogen annealing process preferably ranges between 1 and 750 Torr and further preferably is about 50 Torr in order to enhance the electrical property of the wiring formed on the substrate and the adhesive property with the underneath layer. The nitrogen gas fed from the first nitrogen gas ballast line 39 allows the exhaust gas to be diluted, thereby lowering the hydrogen concentration in the exhaust gas.

The condition for a natural explosion of hydrogen gas requires the hydrogen concentration between 4% and 70%. In order to lower the hydrogen concentration in the exhaust gas released from the exhaust pump 40 below 4%, the exhaust dilution line 48 dilutes the exhaust gas by regulating the flow rate of the nitrogen gas with the flow controller 66. The L-type nozzle 49 that opens toward the downstream is so designed as not to perturb the flow of the exhaust gas in the exhaust duct 50.

Then, the diluted exhaust gas is released through the exhaust duct 50.

As described above, the control of the exhaust gas resistance by the flow regulating valve 38 as well as the control of the back pressure with the flow rate of nitrogen gas through the first nitrogen gas ballast line 39 allows the reaction chamber 2 to maintain a predetermined decompression state; and the flow rate of nitrogen gas through the first nitrogen gas ballast line 39 as well as the flow rate of nitrogen gas through the exhaust dilution line 48 lowers the hydrogen concentration in the released exhaust gas below 4%, resulting in a safe realization of the depressurized hydrogen annealing process.

Figure 2:
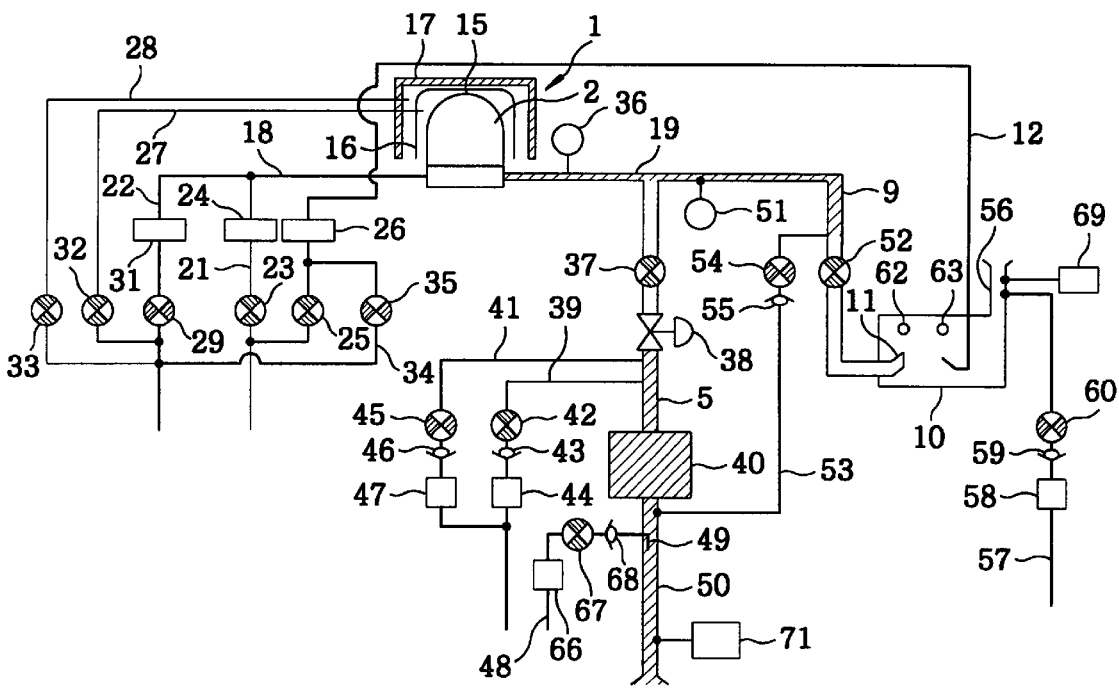
FIG. 2 shows a block diagram for illustrating a purging step of the depressurized hydrogen annealing process in accordance with the present invention.

Referring to FIG. 2, there is illustrated a purging step of the depressurized hydrogen annealing process.

In the purging step, the exhaust pump 40 is turned off, the second dilution line switching valve 33, the first dilution line switching valve 32, the hydrogen gas cutout valve 23, the ignition line switching valve 25, the exhaust switching valve 37, the first switching valve 42 and the switching valve 52 turn to be closed and the nitrogen gas cutout valve 29, the bypass switching valve 35, the second switching valve 45, the switching valve 54, the switching valve 67 and the switching valve 60 turn open.

Nitrogen gas is fed through the nitrogen gas introduction line 22 and the gas introduction line 18 to the reaction chamber 2. Accordingly, the hydrogen gas in the reaction chamber 2 may be forcibly expelled out so that the hydrogen gas in the reaction chamber 2 may be replaced with the nitrogen gas. The nitrogen gas in the reaction chamber 2 may be released through the hydrogen combustion pipe 9 and the connection line 53 to the exhaust duct 50 at the downstream of the exhaust pump 40 and, therefore, the remaining hydrogen gas in the hydrogen combustion pipe 9 may be discharged.

The nitrogen gas is also fed through the second nitrogen gas ballast line 41 into the vacuum evacuation line 5, at a position thereof located in the upstream of the exhaust pump 40 so that the vacuum evacuation line 5 may be filled with the nitrogen gas and the overflowed nitrogen gas is discharged through the exhaust pump 40 to the exhaust duct 50. Since the exhaust pump 40 remains off during the purging step, the flow rate of the nitrogen gas, which is fed from the second nitrogen gas ballast line 41 and released through the exhaust pump 40, is much smaller.

Since the exhaust gas may contain the hydrogen gas, the nitrogen gas is fed through the exhaust dilution line 48 to lower the hydrogen concentration in the exhaust gas below 4%.

Nitrogen gas is fed through the nitrogen gas bypass line 34 to the hydrogen ignition line 12 to release the hydrogen gas within the hydrogen ignition line 12. The nitrogen gas is released through the hydrogen ignition line 12 to the combustion chamber 10 and, then, discharged through the exhaust duct 56. If the nitrogen gas released from the hydrogen ignition line 12 contains the hydrogen gas, more nitrogen gas is further fed through the exhaust dilution line 57 when the exhaust duct 56 starts to discharge the exhaust gas to make it sure that the hydrogen concentration is secured to drop under 4%.

If leakages of hydrogen gas cause the space between the reaction tube 15 and the soaking tube 16 or the space between the soaking tube 16 and the heater 17 to be filled with the hydrogen gas, the nitrogen gas dilution lines 27 and 28 are used to lower the hydrogen concentration below a predetermined threshold by opening the first dilution line switching valve 32 of the nitrogen gas dilution line 27 and the second dilution line switching valve 33 of the nitrogen gas dilution line 28. The nitrogen gas may be supplied periodically for a predetermined duration or as a constant flow at a low rate.

Figure 3:
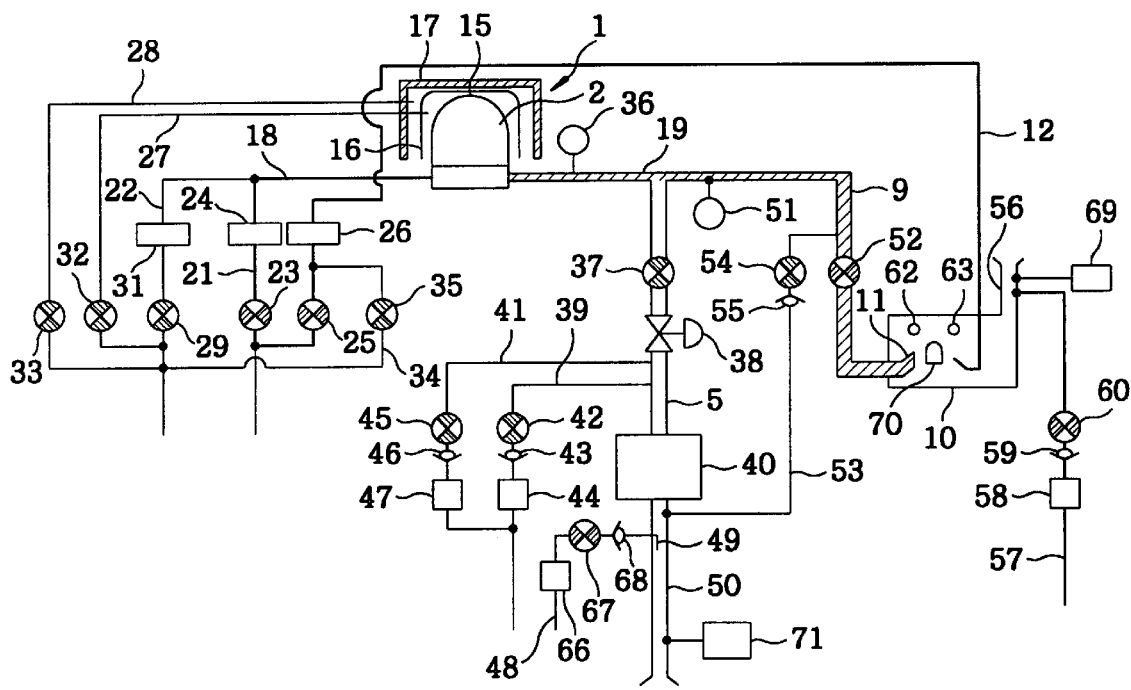
FIG. 3 describes a block diagram for illustrating an atmospheric hydrogen annealing process in the hydrogen annealing apparatus in accordance with the present invention.

FIG. 3 shows a block diagram for illustrating an atmospheric hydrogen annealing process in accordance with the present invention.

The second dilution line switching valve 33, the first dilution line switching valve 32, the nitrogen gas cutout valve 29, the bypass switching valve 35, the second switching valve 45, the first switching valve 42, the exhaust switching valve 37, the switching valve 67 and the switching valve 54 turns to be closed; and the switching valve 52 and the switching valve 60 turns open.

The hydrogen gas cutout valve 23 turns open. The flow controller 24 controls the flow rate of the hydrogen gas so that the hydrogen gas in the reaction chamber 2 may be in the atmospheric pressure. Since the ignition line switching valve 25 also turns open, the hydrogen gas is fed through the hydrogen ignition line 12 to the combustion chamber 10 and, then, ignited to be burned by an ignition pilot.

The exhaust gas remained in the reaction chamber 2 is released through the hydrogen combustion pipe 9 to the combustion nozzle 11. The remaining hydrogen gas, which has not reacted yet, is fired with the ignition pilot to be burned.

The exhaust gas after burned is released through the exhaust duct 56. The exhaust duct 56 is supplied with nitrogen gas through the exhaust dilution line 57 to lower the hydrogen concentration. Since the gas concentration detector 69 detects the hydrogen concentration in the exhaust gas released through the exhaust duct 56, the flow rate of the nitrogen gas may be controlled to lower the hydrogen concentration below 4%. If the hydrogen concentration turns to be higher than 4%, the exhaust dilution line 57 continues to supply the nitrogen gas while the hydrogen gas cutout valve 23 and the ignition line switching valve 25 turns to be closed so that the hydrogen annealing process is halted. For example, in case when the hydrogen concentration is higher than 4%, an ignition pilot 70 is extinguished so that the hydrogen gas released from the combustion nozzle 11 may not be burned.

Then, the atmospheric hydrogen annealing process may be executed.

Figure 4:
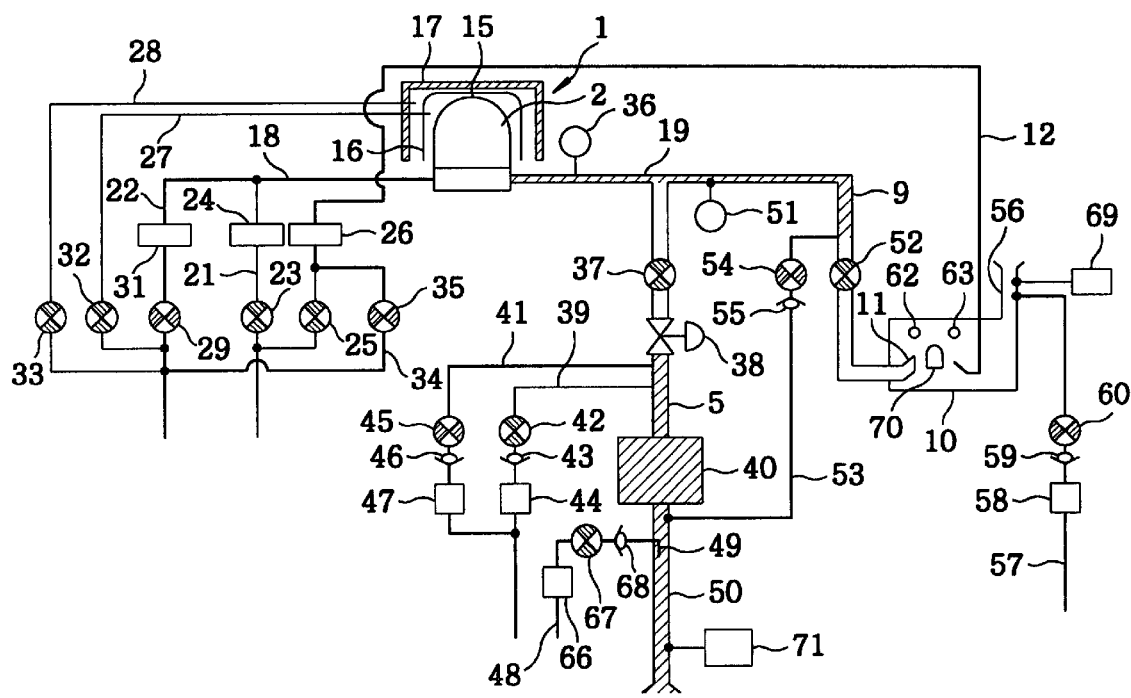
FIG. 4 provides a block diagram for illustrating a purging step of the atmospheric annealing process in accordance with the present invention.

After the atmospheric hydrogen annealing process is over, as shown in FIG. 4, the second dilution line switching valve 33, the first dilution line switching valve 32, the hydrogen gas cutout valve 23, the ignition line switching valve 25, the exhaust switching valve 37, the first switching valve 42 and the switching valve 52 turn to be closed.

The nitrogen gas cutout valve 29, the bypass switching valve 35, the second switching valve 45, the switching valve 67, the switching valve 54 and the switching valve 60 turn open.

Since the nitrogen gas cutout valve 29 turns to be closed, the reaction chamber 2 is supplied with the nitrogen gas through the nitrogen gas introduction line 22 so that the hydrogen gas in the reaction chamber 2 is replaced with the nitrogen gas. While the hydrogen gas in the reaction chamber 2 is being replaced with the nitrogen gas, the hydrogen gas is released from the hydrogen combustion pipe 9. Since the switching valve 52 is still closed, the hydrogen gas is released through the connection line 53 to the exhaust duct 50. The nitrogen gas is supplied into the exhaust duct 50 through the L type nozzle 49 of the exhaust dilution line 48. Since a gas concentration detector 71 detects the hydrogen concentration in the exhaust gas released from the exhaust duct 50, the flow controller 66 may control the flow rate of the nitrogen gas through the L type nozzle 49 in order to make the hydrogen concentration lower than 4%.

Since the bypass switching valve 35 is open, the nitrogen gas is fed through the nitrogen gas bypass line 34 to the hydrogen ignition line 12 so that the hydrogen gas in the hydrogen ignition line 12 may be repelled out by the nitrogen gas. Until there is no hydrogen gas in the hydrogen ignition line 12, the ignition pilot 70 must be kept lighted. Since the gas concentration detector 69 detects the hydrogen concentration in the exhaust gas released from the exhaust duct 56, the flow controller 58 on the exhaust dilution line 57 may control the flow rate of the nitrogen gas thereof in order to lower the hydrogen concentration in the exhaust gas below 4%.

After the exhaust gas is diluted with the nitrogen gas, the diluted exhaust gas is released through the exhaust duct 50 and the exhaust duct 56.

If the hydrogen gas is completely evacuated from the reaction furnace 1, the hydrogen combustion pipe 9 and the hydrogen ignition line 12, the purging step after the depressurized hydrogen annealing process as shown in FIG. 2 is substantially equal to the purging step after the atmospheric hydrogen annealing process as shown in FIG. 4.

During the depressurized hydrogen annealing process and the atmospheric hydrogen annealing process, the pressure sensor 36 always detects the pressure in the reaction chamber 2; the gas concentration detectors 69 and 71 detect the hydrogen concentration in the exhaust gas; and the temperature sensor 62 and the spark detection sensor 63 detect the combustion state in the exhaust gas. If any sensor detects an abnormal state, error messages may be displayed on display means. If the hydrogen concentration in the exhaust gas is higher than a predetermined value or the temperature sensor 62 and the spark detection sensor 63 detect the hydrogen gas is not completely burned, the hydrogen gas cutout valve 23 will be closed so that the hydrogen annealing apparatus will be allowed to be in the purging step in accordance with the present invention.

Since the pressure in the depressurized hydrogen annealing process ranges from 1 to 750 Torr as set forth above so that a much higher vacuum degree may not be required, an orifice may be installed on behalf of the exhaust pump 40 on the vacuum evacuation line 5, wherein a decompression space, e.g., the reaction chamber 2, may be coupled to the orifice. In order words, an exhaust device may be used such as a ventury pump, i.e., a Convum ventury pump, which a static flow pressure of the fluid is applied. The Convum ventury pump may generate a decompression state with several Torr, which is enough to complete the depressurized hydrogen annealing process in accordance with the present invention. While the pumping suspension caused by the mechanical problem in the exhaust pump results in the backflow of the gas, which may cause an explosion of the gas, the Convum ventury pump guarantees a more safe use in this point. It may not be limited to the nitrogen gas so any inert gas may be used as a dilution gas if it prevents the hydrogen gas from burning.

The depressurized hydrogen annealing process as described above in accordance with the present invention may effectively expels gas molecules or impurities from the substrate to enhance the electrical property.

Since the hydrogen annealing apparatus includes the reaction chamber, the hydrogen gas introduction line for feeding hydrogen gas into the reaction chamber and the atmospheric exhaust line and the depressurized exhaust line connected to the reaction chamber; and especially, since by switching the atmospheric exhaust line with the depressurized exhaust line, the depressurized hydrogen annealing process and the atmospheric annealing process can be selectively performed, the deoxidization device, the impurity removal device and so on can be selected to enhance the quality of the product.

Since the hydrogen annealing apparatus includes the reaction chamber, the hydrogen gas introduction line for feeding hydrogen gas into the reaction chamber, the atmospheric exhaust line and the depressurized exhaust line connected to the reaction chamber and the valve for switching the atmospheric exhaust line with the depressurized exhaust line to the reaction chamber; and especially since the apparatus can perform both the depressurized annealing process and the atmospheric annealing process, the number of elements in the hydrogen annealing apparatus can be reduced and, therefore, the equipment cost can be less.

While the invention has been shown and described with respect to the preferred embodiments, it will be understood by those skilled in the art that various changes and modifications may be made without departing from the spirit and scope of the invention as defined in the following claims.

What is claimed is:

1. A method for performing a hydrogen annealing process in a hydrogen annealing apparatus, wherein the hydrogen annealing apparatus include a reaction chamber, a hydrogen gas introduction line for feeding hydrogen gas into the reaction chamber, an atmospheric exhaust line and a depressurized exhaust line, comprising the step of:

switching the atmospheric exhaust line and the depressurized exhaust line for its connection to the reaction chamber to selectively perform a depressurized hydrogen annealing process or an atmospheric hydrogen annealing process in the reaction chamber.

2. The method of claim 1, wherein the pressure in the depressurized hydrogen annealing process ranges between about 1 and about 750 Torr.

3. A hydrogen annealing apparatus comprising:

a reaction chamber;

a hydrogen gas introduction line for feeding hydrogen gas into the reaction chamber;

an exhaust line connected to the reaction chamber;

an exhaust device installed on the exhaust line; and an exhaust dilution line for providing a dilution gas to a downstream of the exhaust device to lower a hydrogen concentration therein below a predetermined value.

4. A hydrogen annealing apparatus comprising:

a reaction chamber;

a hydrogen gas introduction line for feeding hydrogen gas into the reaction chamber;

an atmospheric exhaust line;

a depressurized exhaust line; and a valve for selectively switching the atmospheric or the depressurized exhaust line for its connection to the reaction chamber to selectively perform a depressurized hydrogen annealing process or an atmospheric hydrogen annealing process in the reaction chamber.

5. The hydrogen annealing apparatus of claim 4, further comprising:

a hydrogen gas combustion chamber connected to the atmospheric exhaust line;

an exhaust device connected to the depressurized exhaust line; and an exhaust dilution line for providing a dilution gas to a downstream of the exhaust device to lower a hydrogen concentration therein below a predetermined value.

6. The hydrogen annealing apparatus of claim 5, further comprising:

a gas concentration detector installed at a downstream of the exhaust device; and a flow controller, installed on the exhaust dilution line, for controlling a flow rate of the dilution gas to lower the hydrogen concentration in the exhaust device below about 4%.

7. The method of claim 1, wherein the hydrogen annealing apparatus further includes:

a hydrogen gas combustion chamber connected to the atmospheric exhaust line;

an exhaust device connected to the depressurized exhaust line; and an exhaust dilution line for providing a dilution gas to a downstream of the exhaust device to lower a hydrogen concentration therein a below a predetermined value.

8. The method of claim 7, wherein the hydrogen annealing apparatus further includes:

a gas concentration detector installed at a downstream of the exhaust device; and a flow controller, installed on the exhaust dilution line, for controlling a flow rate of the dilution gas to lower the hydrogen concentration in the exhaust device below about 4%.

9. A hydrogen annealing apparatus, which includes a reaction chamber, an atmospheric exhaust line and a depressurized exhaust line, comprising:

means for feeding hydrogen gas into the reaction chamber; and means for switching the atmospheric exhaust line and the depressurized exhaust line for its connection to the reaction chamber to selectively perform a depressurized hydrogen annealing process or an atmospheric hydrogen annealing process in the reaction chamber.

10. The hydrogen annealing apparatus of claim 9, wherein the pressure in the depressurized hydrogen annealing process ranges between about 1 and about 750 Torr.

11. The hydrogen annealing apparatus of claim 9, further comprising:

means, connected to the atmospheric exhaust line, for combusting the hydrogen gas therein;

means, connected to the depressurized exhaust line, for exhausting the hydrogen gas therein; and means for providing a dilution gas to a downstream of the exhausting means to lower a hydrogen concentration therein below a predetermined value.

12. The hydrogen annealing apparatus of claim 11, further comprising:

means, connected at a downstream of the exhausting means, for detecting the hydrogen concentration therein; and means, connected on the providing means, for controlling a flow rate of the dilution gas to lower the hydrogen concentration in the exhausting means below about 4%.

* * * * *